(12) United States Patent
Burns et al.

(10) Patent No.: US 8,400,576 B2
(45) Date of Patent: Mar. 19, 2013

(54) TRANSISTOR-CONTROLLED DISPLAY DEVICES

(75) Inventors: Seamus Burns, Cambridge (GB); Henning Sirringhaus, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 967 days.

(21) Appl. No.: 10/544,523

(22) PCT Filed: Feb. 4, 2004

(86) PCT No.: PCT/GB2004/000433
§ 371 (c)(1),
(2), (4) Date: May 11, 2006

(87) PCT Pub. No.: WO2004/070466
PCT Pub. Date: Aug. 19, 2004

(65) Prior Publication Data
US 2006/0250558 A1    Nov. 9, 2006

(30) Foreign Application Priority Data

Feb. 4, 2003    (GB) .................................... 0302485.8

(51) Int. Cl.
*G02F 1/136*    (2006.01)
(52) U.S. Cl. ............................................. 349/43; 349/44
(58) Field of Classification Search .................... None
See application file for complete search history.

(56) References Cited

U.S. PATENT DOCUMENTS

| | | | | |
|---|---|---|---|---|
| 4,695,357 A | * | 9/1987 | Boussert .................. 204/157.41 |
| 5,153,702 A | * | 10/1992 | Aoyama et al. ............... 257/347 |
| 5,164,851 A | * | 11/1992 | Kanemori et al. .............. 349/55 |
| 5,822,027 A | * | 10/1998 | Shimada et al. ................ 349/39 |
| 5,831,692 A | * | 11/1998 | Lee .................................. 349/38 |
| 5,859,683 A | * | 1/1999 | Tagusa et al. ................. 349/138 |
| 5,955,744 A | | 9/1999 | Den Boer et al. |
| 6,122,033 A | | 9/2000 | Mathew et al. |
| 6,137,551 A | * | 10/2000 | Jeong ............................. 349/38 |

(Continued)

FOREIGN PATENT DOCUMENTS

EP    0555100 A    11/1993
EP    0664473 A    7/1995

(Continued)

OTHER PUBLICATIONS

Machine translation of JP 06-342153.*

(Continued)

*Primary Examiner* — Lucy Chien
(74) *Attorney, Agent, or Firm* — Sughrue Mion, PLLC

(57) ABSTRACT

A device architecture for an active matrix display pixel comprising source addressing lines and TFT drain electrode formed on a first metal level of the device, the pixel electrode formed on a second, separate metal level, and the TFT gate electrode and gate addressing lines on a third metal level separated from both the first level and the second level by at least one dielectric layer, wherein the pixel electrode on the second level is electrically connected to the drain electrode on the first level through a via-hole connection and a pixel capacitor is formed by overlap of part of the pixel electrode on the second level with a portion of the gate addressing line of a neighboring line of pixels on the third level. The device is formed preferably using print based methods.

9 Claims, 5 Drawing Sheets

U.S. PATENT DOCUMENTS

| | | | |
|---|---|---|---|
| 6,137,552 A | 10/2000 | Yanai | |
| 6,211,468 B1 | 4/2001 | Windshitl | |
| 6,274,412 B1 | 8/2001 | Kydd et al. | |
| 6,278,504 B1 * | 8/2001 | Sung | 349/46 |
| 6,284,564 B1 * | 9/2001 | Balch et al. | 438/106 |
| 6,395,586 B1 | 5/2002 | Huang et al. | |
| 6,429,918 B1 | 8/2002 | Chio et al. | |
| 6,479,838 B2 | 11/2002 | Morosawa | |
| 6,841,798 B2 * | 1/2005 | Chung et al. | 257/72 |
| 7,303,809 B2 * | 12/2007 | Choi et al. | 428/212 |
| 2001/0005019 A1 | 6/2001 | Ishikawa | |
| 2001/0019322 A1 | 9/2001 | Ashizawa et al. | |
| 2002/0027635 A1 * | 3/2002 | Sakamaki et al. | 349/153 |
| 2002/0044243 A1 * | 4/2002 | Kim et al. | 349/139 |
| 2002/0180900 A1 | 12/2002 | Chae et al. | |
| 2004/0075789 A1 * | 4/2004 | Wang | 349/106 |

FOREIGN PATENT DOCUMENTS

| | | |
|---|---|---|
| JP | 11330483 A | 11/1999 |
| KR | 1999-0077005 B1 | 10/1999 |
| KR | 1999-0082888 B1 | 11/1999 |
| KR | 2000-0025527 B1 | 5/2000 |
| KR | 2001-0001159 B1 | 1/2001 |
| KR | 2001-0072399 A | 7/2001 |
| WO | 97/25844 A1 | 7/1997 |
| WO | WO 01/47045 A | 6/2001 |

OTHER PUBLICATIONS

English Abstract of JP 03-102324.*
Japanese Office Action corresponding to Japanese Patent Application No. 2006-502233, dated Dec. 15, 2010.
Translation of communication from Korean Patent Office dated Apr. 9, 2012 issued in Korean Application No. 10-2005-7014405.

* cited by examiner

Figure 1.a.
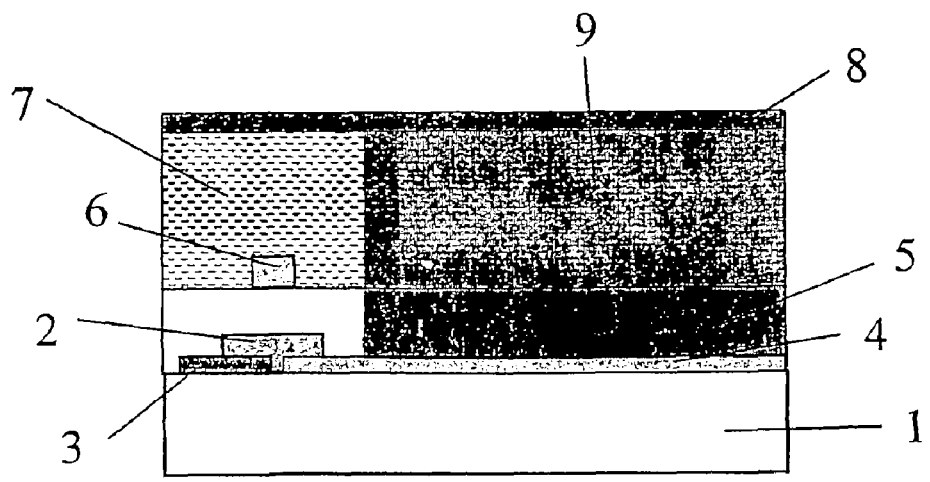
Figure 1.b.
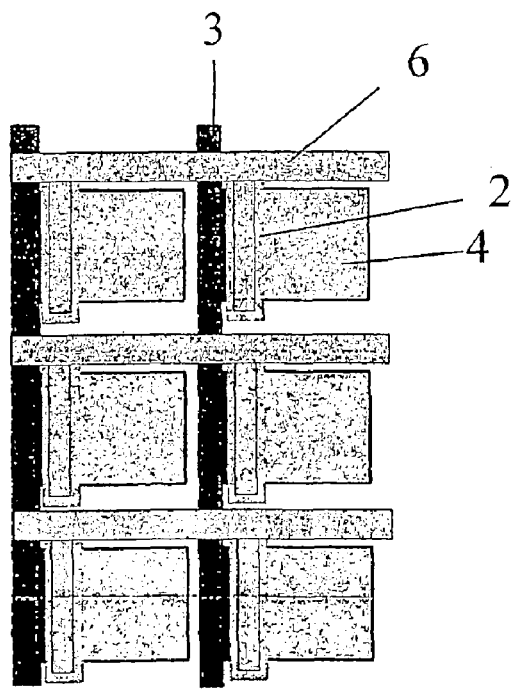

Figure 2.a.
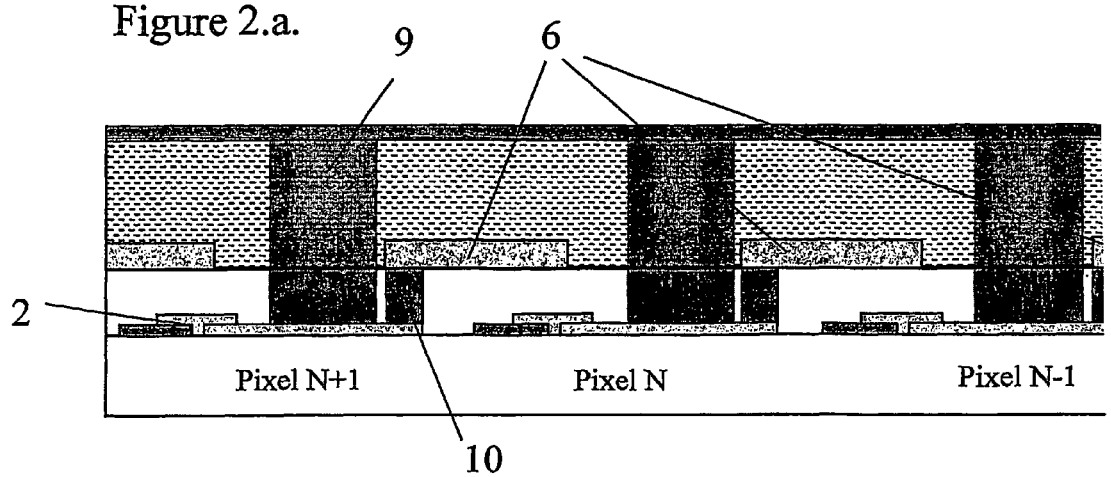
Figure 2.b.
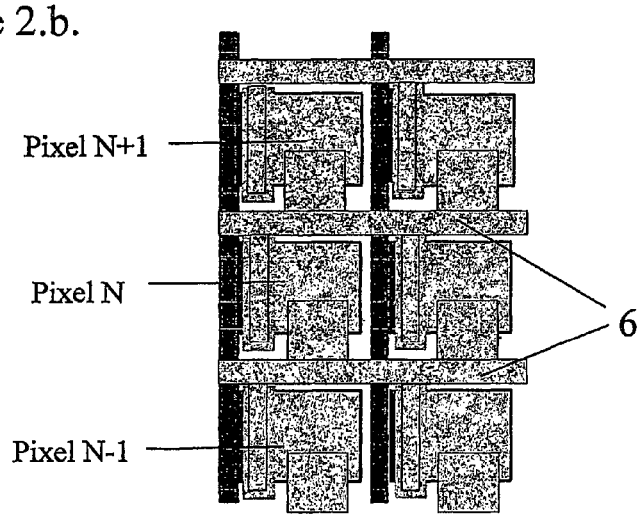
Figure 2.c.
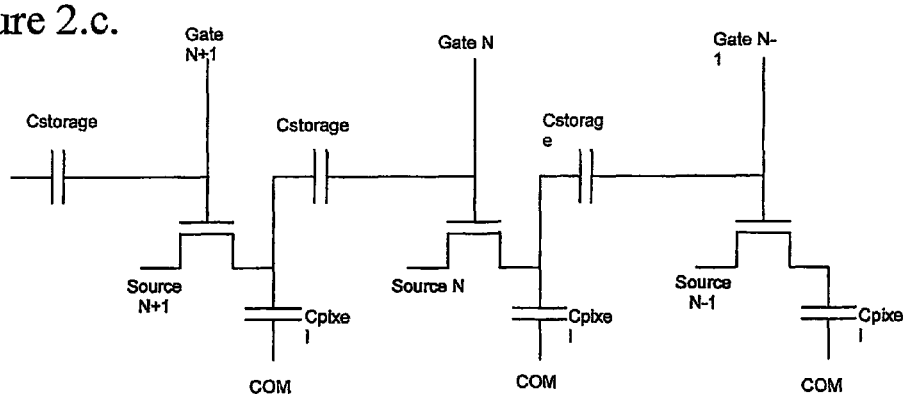

Figure 3.a.
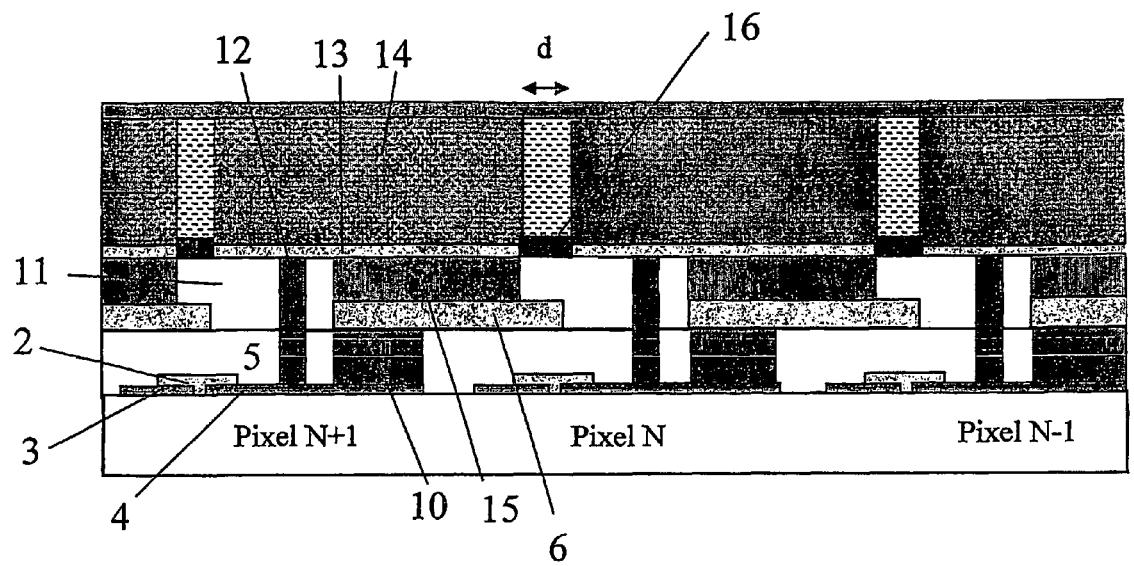
Figure 3.b.
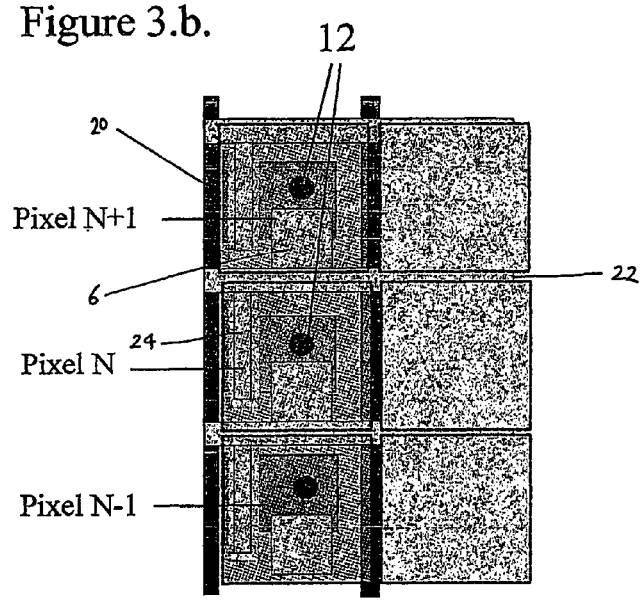

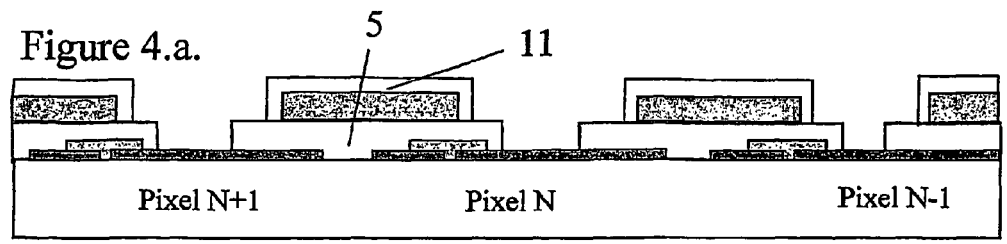
Figure 4.a.
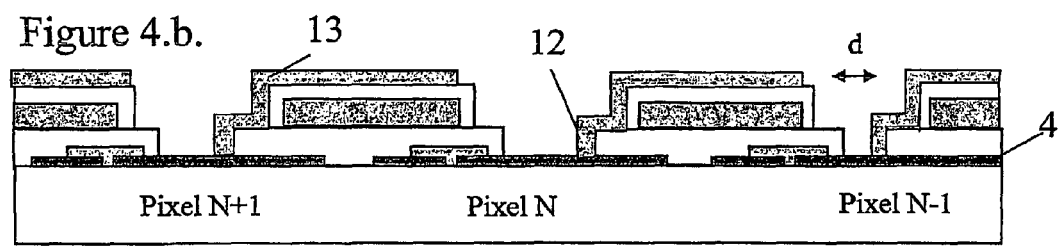
Figure 4.b.
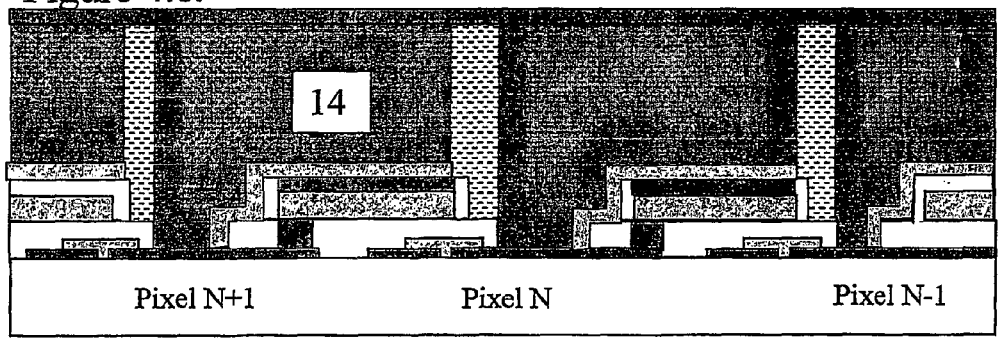
Figure 4.c.
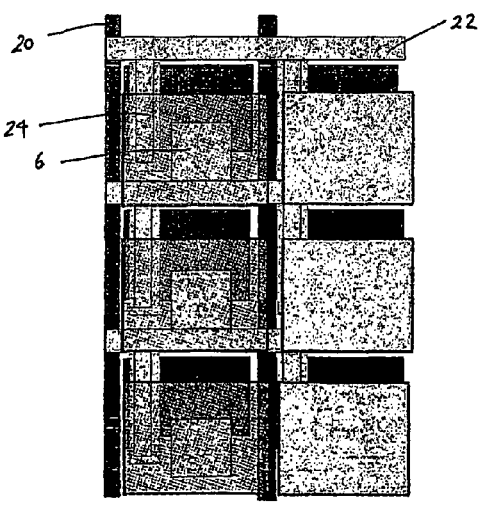
Figure 4.d.

Figure 5.a.
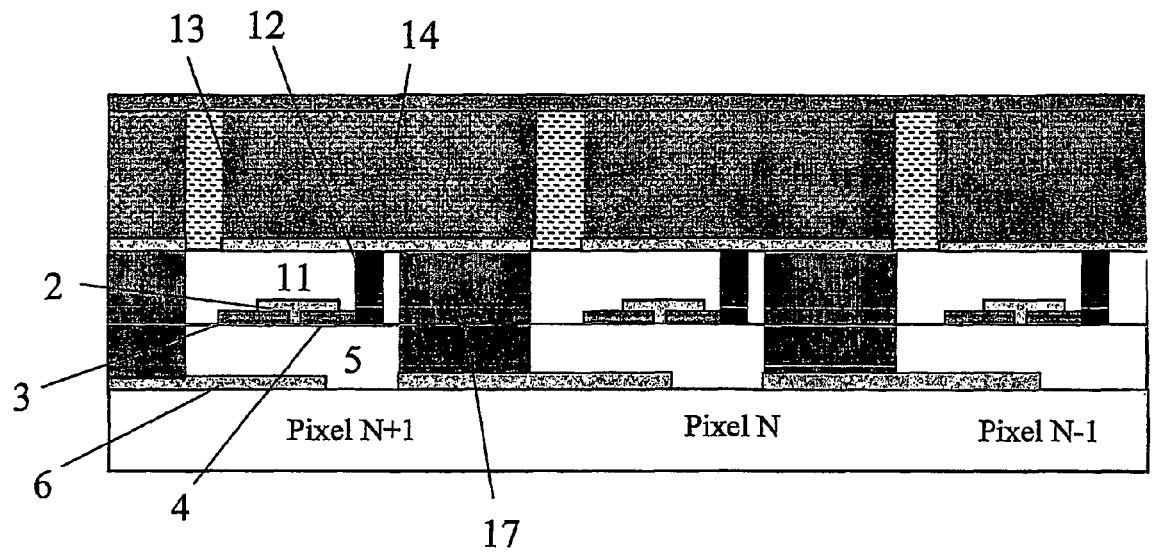
Figure 5.b.
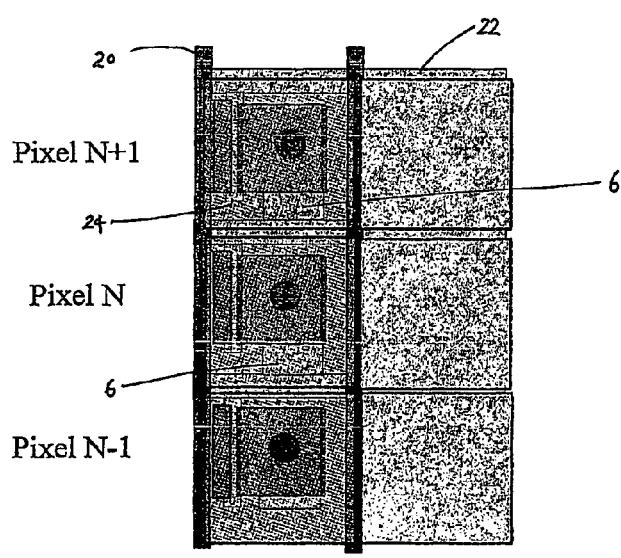

TRANSISTOR-CONTROLLED DISPLAY DEVICES

This invention relates, in one aspect, to transistor-controlled display devices and techniques of use in their production, and in one embodiment to active matrix polymer TFT displays, having enhanced aperture ratios and pixel storage capacitors, more specifically the formation of high-resolution active matrix displays using techniques based on solution processing and direct printing.

The most common active matrix display technology is the thin film transistor liquid crystal display (LCD), where applications range from PDA and notebook devices to flat screen televisions. Active matrix displays are also used in combination with emerging display effects such as organic light emitting diodes (OLED) and electronic paper.

A TFT device configuration is described in WO01/47045.

Semiconducting conjugated polymer thin-film transistors (TFTs) have recently become of interest for applications in active-matrix displays, primarily due to their solution processibility and consequential printability. Such polymers were used as the active material to create a 4096 active matrix pixel display with 256 grey levels (E. A. Huitema et al., Nature 414, 599 (2001)). Semiconducting polymers in solution based print processes have more recently been used to create active matrix displays with printed polymer thin film transistors (S. Burns, et al. SID 2002 symposium, Digest of Technical Papers 33, 1193 (2002)).

One problem can be the limited display area, in particular for high-resolution displays, in which the thin film transistor, particularly the drain pixel) electrode, and other components, such as the data and addressing lines, and the pixel capacitor compete with each other for space. This can lead to a reduction in the aperture ratio and therefore the quality of the display. In order to achieve a high aperture ratio, the area of the pixel electrode should be as large as possible. This is particularly difficult to achieve in conventional architectures, if the pixel electrode is defined on the same level as any of the gate or addressing lines, or any of the electrodes of the TFT.

The manufacture of active matrix displays by solution based print processes offers many potential advantages over conventional manufacturing methods. In principle, solution based print processes are environmentally friendly, low temperature, compatible with flexible substrates, cost effective and advantageous for short run length and large display sizes. However, fabrication of high-resolution displays by printing processes is challenging. When using printing processes such as inkjet printing, screen printing and offset printing, it is difficult to fabricate metallic interconnect lines with a width of less than 50-100 μm because of the difficulties associated with delivering small volumes of liquid. This problem can be alleviated somewhat by printing onto a substrate with a pre-defined surface energy pattern as disclosed in PCT/GB00/04934. However, even using this technique, achieving linewidths of less than 10-20 μm can be challenging. Furthermore, many printable conductors such as conducting polymers or colloidal metals have conductivities significantly lower than bulk copper or silver, therefore requiring thick and wide interconnect lines to achieve adequate conductance across a large active matrix. Therefore, by using conventional display architectures, printed components can tend to be large and result in active matrix displays with low aperture ratios.

Accordingly, it is one aim of the present invention to provide a thin film transistor device incorporating an architecture resulting in a high aperture ratio and, preferably, allowing for good pixel capacitance.

According to the present invention, there is provided a pixellated display device including a display medium, an array of at least partly printed transistors, addressing lines for controlling the array of transistors and an array of pixel electrodes located at least partly between the array of transistors and the display medium and via which respective portions of the display medium are controllable by the transistors, wherein each pixel electrode is controllable through a respective transistor via one of said addressing lines and also overlaps with another of said addressing lines and/or a counter electrode connected thereto for capacitive coupling therewith.

The present invention also provides an electronic device including an array of at least partly printed transistors, addressing lines for controlling the array of transistors, and an array of pixel electrodes whose electric potentials are responsive to the transistors and which are located at least partly over the transistors, wherein each pixel electrode is controllable through a respective transistor via one of said addressing lines and overlaps with another of said addressing lines and/or a counter electrode connected thereto for capacitive coupling therewith.

The present invention also provides a method of producing a pixellated display device including a display medium, an array of transistors, addressing lines for controlling the transistors, and an array of pixel electrodes located at least partly between the array of transistors and the display medium and via which respective portions of the display medium are controllable by the transistors, wherein each pixel electrode is controllable through a respective transistor via one of said addressing lines and also overlaps with another of said addressing lines and/or a counter electrode connected thereto for capacitive coupling therewith, wherein the method includes the step of forming at least one element of the array of transistors by a printing technique.

The present invention also provides a method of producing an electronic device including a lower conductive layer formed by solution-processing and an upper conductive layer overlying said lower conductive layer and electrically connected thereto via a conductive interconnect through one or more insulator layers, wherein the creation of said interconnect includes: defining in said at least one insulator layer a hole that extends down to at least a portion of the lower conductive layer using a photoablative technique that discriminates between the lower conductive layer and said one or more insulator layers; and then depositing conductive material in said hole.

The present invention also provides a method of producing an electronic device including a lower conductive layer formed by solution-processing and an upper conductive layer overlying said lower conductive layer and electrically connected thereto via a conductive interconnect through one or more insulator layers, wherein the creation of said interconnect includes: defining in said at least one insulator layer a hole that extends down to at least a portion of the lower conductive layer using an embossing technique; and then depositing conductive material in said hole.

The present invention also provides a method of producing an electronic device, including the steps of: forming an array of thin-film transistor (TFT) devices on a substrate at least partly by a printing technique; providing one or more patterned insulator layers over the array of TFT devices so as to leave access to the drain or source electrode of each TFT device from above, and then forming a patterned conductive layer over the one or more patterned insulator layers so as to provide each TFT device with a respective pixel electrode extending from the drain or source electrode thereof up and over the gate electrode thereof or the gate electrode of an adjacent TFT, to thereby increase the aperture ratio.

According to one embodiment of the present invention, a device architecture is disclosed comprising TFT source addressing lines and a TFT drain electrode formed on a first metal level of the device. The pixel electrode is formed on a second separate metal level, and the TFT gate electrode and gate addressing lines on a third metal level, separated from both the first level and the second level by at least one dielectric layer. The pixel electrode on the second level is electrically connected to the drain electrode on the first level through a via-hole interconnection and a pixel capacitor is formed by overlap of part of the pixel electrode on the second level with a portion of the gate addressing line of a neighbouring line of pixels on the third level.

According to another embodiment of the present invention a device architecture is disclosed comprising TFT source addressing lines and a TFT drain electrode formed on a first metal level of the device. The pixel electrode is formed partially on a second separate metal level and partially on the first metal level, and a TFT gate electrode and gate addressing lines on a third metal level separated from both the first level and the second level by at least one dielectric layer. The portion of the pixel electrode on the first level is electrically connected to the drain electrode on the first level, the portion of the pixel electrode on the first and second level are electrically connected by an interconnection formed across the side wall of at least one patterned dielectric layer. A pixel capacitor is formed by overlap of part of the pixel electrode on the second level with a portion of the gate addressing line of a neighbouring line of pixels on the third level.

Another embodiment of the invention allows for the optimisation of the aperture ratio and pixel capacitance through the use of a bottom gate transistor configuration. A transistor with a bottom-gate configuration has an added advantage that a via-hole needs only to be formed through one of the dielectric layers. Where the via hole is produced as a result of solvent jetting, it is necessary to ensure that the chosen solvent does not also dissolve the lower dielectric.

To help understanding of the invention, a specific embodiment thereof will now be described by way of example and with reference to the accompanying drawings, in which:

FIG. 1 shows the general structure of an active matrix display pixel.

FIG. 2 explains the incorporation of a pixel capacitor into a transistor-controlled display device, for the case where the drain electrode is the pixel electrode.

FIG. 3 shows a device according to a first embodiment of the present invention.

FIG. 4 shows a device according to a second embodiment of the present invention.

FIG. 5 shows a bottom gate device according to a third embodiment of the present invention.

FIG. 1 shows an active matrix pixel where the display media is voltage controlled, such as liquid crystal or electronic paper. FIG. 1.a. is a side view of one transistor and one pixel. It consists of a substrate 1, a semiconductor 2, which may be a continuous layer or may be patterned, (in FIG. 1, the semiconductor is patterned in order to cover the transistor channel), a data line 3, a pixel electrode 4, a transistor dielectric 5, a gate electrode/gate interconnect 6 and a display media 7 (for example liquid crystal or electronic paper) and a counter electrode 8 of the display media. In such a system the state of the display media is determined by the electric field across the media, which is a function of the voltage difference between the pixel electrode 4 and the counter electrode 8. A switchable area of the device 9 can be switched by a voltage difference between the pixel 4 and the top electrode 8. This area determines the aperture ratio of the device. FIG. 1.b. is a top view of the device and shows six transistors and six pixels arranged in three rows. (The display media is not shown in FIG. 1.b).

In an active matrix array, the lines are written sequentially. In order to maintain an image, the voltage written to one line should remain relatively constant during the addressing of the other lines. This is particularly true of greyscale devices. In voltage controlled devices, the pixel acts as a parallel plate capacitor providing a reservoir of charge. This capacitance can be augmented by the inclusion of a storage capacitor. A storage capacitor can be formed by overlapping the pixel with the gate line of the neighbouring transistor. FIG. 2 explains the incorporation of a pixel capacitor into a transistor-controlled display device, for the case where the drain electrode is the pixel electrode, and is a schematic diagram of three adjacent pixels, N−1, N and N+1 of a top gate device. FIG. 2.a. shows the side view of the device. The gates/gate interconnects 6 are extended to overlap part of the adjacent pixel. A capacitor 10 is formed between pixel N and the gate of pixel N−1. The resultant storage capacitor helps the pixel to maintain a constant voltage throughout the cycle. However, in this case, this overlap of the adjacent gate interconnect over the lower, drain (pixel) electrode leads to a reduction of the switchable area 9 of the device and therefore, the aperture ratio.

FIG. 2.c. shows the circuit diagram for this arrangement, where the storage capacitor, $C_{storage}$, is formed between the pixel electrode 4 and the gate of a pixel of a neighbouring transistor. This capacitor acts as a reservoir for charge and therefore enhances the image holding ability of the pixel.

A first embodiment of the present invention is illustrated in FIG. 3. This architecture incorporates a pixel capacitor that allows for a high aperture ratio. FIG. 3.a. shows the side view of three adjacent transistors and pixels. FIG. 3.b illustrates a top view of six pixels. Three of these pixel electrodes are shown as being semitransparent, for clarity.

Data addressing lines 20 running across the display, TFT source electrodes 3, and TFT drain electrodes 4 are formed on a first metal level of the device. A metal level is defined as a layer of the device that contains conductive interconnects and/or conductive electrodes. The patterned pixel electrode 13 forming one of the contacts to the display element 14 is formed on a separate, second metal level of the device. The TFT gate electrode 24, the gate addressing row interconnects 22 and the counter electrode of the pixel capacitor 6 are formed on a third metal level of the device. In between the first and third metal level and the second and third metal level is at least one dielectric layer 5, 11 which provides electrical insulation between the electrodes and interconnects at different levels. In the embodiment shown in FIG. 3 the dielectric between the first and third level is the gate dielectric 5 of the TFT.

The pixel electrode 13 on the second-level is electrically connected to the drain electrode 4 on the first level. In the configuration shown in FIG. 3, the latter is achieved by the formation of a via-hole interconnection 12. This interconnection is formed both through the dielectric layer 11 between the second and third levels, and the dielectric layer 5 between the first and third levels.

The source and drain electrodes 3, 4 may be formed as follows. A surface energy pattern is defined on a substrate that consists of an array of hydrophobic and hydrophilic regions. This surface energy pattern is formed as a result of a hydrophobic polymer, such as polyimide (PI), being deposited and patterned on top of a hydrophilic glass substrate. The source and drain electrodes are deposited through ink jet printing from a liquid material, such as PEDOT/PSS, within the hydrophilic wells. The hydrophobic ridges define the TFT channel.

In order to achieve a particularly high aperture ratio the pixel electrodes 13 of neighbouring pixels on the second metal level may be printed with a small distance of typically on the order of 15-20 µm between each other. This small gap between neighbouring pixel electrodes needs to be defined very reliably in order to avoid electrical shorting from one pixel to the next. A surface energy pattern 16 can be predefined on the second metal level prior to the deposition of the pixel electrodes 13 to repel the ink of the conducting pixel electrode material, and define accurately the dimensions of the pixel electrode. The surface energy pattern can be defined by techniques such as laser forward transfer printing, photolithographic patterning, laser direct write patterning, soft lithographic stamping, embossing, inkjet deposition, or other direct-write deposition and patterning techniques.

A second embodiment of the present invention and its method of production is shown in FIG. 4. This configuration is a variation of the architecture shown in FIG. 3. In the present embodiment either one or both of the dielectric layers 5, 11 are patterned and the pixel electrode 13 is formed partially on the first level and partially on the second level with a metallic interconnection formed across a side wall of the patterned dielectric(s). According to one preferred aspect of this embodiment, the dielectric layer(s) are patterned by direct-write deposition, such as, for example, inkjet printing or screen printing. Preferably the pixel electrode 13 is also deposited by direct-write printing, for example, by printing a conductive material over the sidewalls of the dielectric pattern to form the electrical connection between the pixel electrode 13 and the drain electrode 4. The pattern of the dielectric layers 5, 11 is defined in such a way that adequate isolation is achieved between the gate electrodes/interconnects 22, 24 on the third level, and the other electrodes 3, 4, 13 on the first and second levels. One advantage of the configuration illustrated in FIG. 4 is that it does not require formation of a via-hole interconnection, although the area on the first and third level that is available for electrodes and interconnects is reduced compared to the configuration shown in FIG. 3.

The pixel capacitor is formed between the pixel capacitor counter electrode 6 which is connected to the gate addressing lines of the (N−1) or (N+1)th row of pixels, and the pixel electrode 13 on the third level. According to another embodiment of the invention it is also possible to form an additional capacitor 10 between the pixel capacitor counter electrode 6 on the third level, and an extension of the drain electrode 4 on the first level (see also FIG. 3). This increases the total capacitance of the pixel capacitor for a given area of the pixel capacitor counter electrode 6.

On each level, the electrodes and interconnects can occupy a significant fraction of the pixel area In the present embodiment, each pixel electrode covers the respective pixel area of the second level almost completely with only a small gap of dimension d left to the neighbouring pixels. This achieves aperture ratios close to 100%. This configuration has the following additional advantages. On the first level the width of the data addressing lines 20 can be made relatively large in order to achieve better conductivity. The width of the channel of the TFT can be increased by, for example forming the source and drain electrodes 3, 4 in an interdigitated configuration or by forming the source electrode 3 on all four sides of the pixel. The source and drain electrodes 3, 4 can cover a significant fraction of the area of the first level. On the third level the width of the gate addressing interconnects can be increased in order to achieve a better conductivity. The size of the pixel capacitor counter electrode 6 and its lateral overlap with the pixel electrode 13 may be adjusted so that it occupies a significant fraction of the area of the third level.

This invention is not limited to the top gate transistor configurations shown in FIGS. 3 and 4. A third embodiment of the invention is shown in FIG. 5. This Figure illustrates how bottom gate transistor configurations may also be used that allow for the optimisation of the aperture ratio and pixel capacitance. FIG. 5 shows a first dielectric 5 deposited on the pixel capacitor counter electrode 6 positioned on a first metal level. Source and drain electrodes 3, 4 are shown on the second metal level with the upper, pixel electrode 13 positioned on top of the semiconductor and dielectric layers 2, 11. The bottom gate configuration has the added advantage that a via-hole needs only to be formed through one of the dielectric layers. To prevent the via-hole from going through both of the dielectric layers, an etch stop mechanism is required. For example, in the instance where the via is formed by the jetting of solvent, the lower dielectric layer 5 and the drain electrode 4 should not be soluble in the solvent in which the upper electrode 11 dissolves. Where the via is formed by laser ablation, a lower layer that is non-absorbing at the laser wavelength and an upper layer that is absorbing at the laser wavelength may be used in combination to selectively remove material from one layer and leave the other in place.

Preferably all of the device components (interconnects, electrodes, semiconductor and insulating elements) of each of the above mentioned embodiments are deposited by solution processing and/or direct printing. This may be done, for example, by inkjet printing, aerosol printing, offset printing, solution or blade coating. To achieve a high resolution of such solution deposition steps, a surface energy pattern may be formed on the substrate prior to deposition of the electrodes and interconnects on each level. Surface energy patterning can be achieved by a range of techniques including, but not limited to photolithography, microcontact printing or exposure to focussed electromagnetic radiation (see WO02/095805). The surface energy pattern makes the surface regions that are to be kept free of conducting material repulsive for the ink of the conducting material. This allows printing of narrow interconnect lines and electrodes, and also allows to minimize the size of any gaps required between different electrodes on the same metal level, such as the distance d. Surface energy patterning can be performed on any of the metal levels prior to deposition of the conductive material.

Via hole formation is preferably carried out by a direct-write based method such as laser ablation or ink jetting of solvent. However, via holes may also be made by other methods such as mechanical means or photolithography. After the via-hole is formed it can be filled with conductive material, preferably using a print based method such as ink jet.

In a reflective display where the pixel electrode itself is formed from a highly reflective metal such as silver or gold, such that the light does not pass through the first and third metal level, the above three-metal level configuration allows to achieve high values of the capacitance of the pixel capacitor, while maintaining high aperture ratios, that can in principle be close to 100%. This is true whether the electrodes and interconnects are formed from optically transparent conductive material or not.

In a transmissive display, or in a reflective display where the reflective mirror is formed behind the active matrix such that the light passes through the layers of the active matrix array, high aperture ratios can be achieved by using transparent conductive materials, such as PEDOT/PSS or ITO for all electrodes that occupy a large area The use of non-transparent conductors may be restricted to ones such as inkjet printed or aerosol printed colloidal metal in the case of interconnects that require a high conductivity close to that of bulk copper or silver, such as the long gate addressing interconnects and the data addressing interconnects running across the display. The pixel electrode, the pixel capacitor counter electrode, the via-hole interconnection and the source/drain/gate electrodes may all be formed from a transparent conductor such as printable transparent tin oxides or PEDOT/PSS.

In the configuration illustrated in FIG. 3, above the gate level, there is a further insulating layer 11. A conducting via-hole interconnection 12 runs from the drain electrode 4 of the transistor through the dielectric and insulating layers to an enlarged pixel electrode 13. The switchable area of the display medium 14 and therefore the aperture ratio is enlarged and can be close to 100%. Similarly, the storage capacitor 10 can be increased.

This device structure also allows the pixel capacitor to be double sided. For example, a capacitor is formed between a) the middle and the lower level and b) the middle and upper level. This provides the capability to produce a very large pixel capacitor whilst maintaining an aperture ratio of near 100%.

Another method of achieving the same effect as the structure in FIG. 3 is to pattern the dielectric layers such as to cover only the parts of the metal layers that we need to isolate. FIG. 4.a. shows a display structure built up to the gate level, with extended gates as described previously. The insulating layers, 5 and 11 are patterned so as only to isolate the necessary components of the metal layers. In FIG. 4.b. a conducting interconnect 12 is formed between the drain electrode 4 and the upper, pixel electrode 13. The advantage of this structure is that the connecting interconnect need only be deposited by solvent or mechanical methods, since there is no requirement to form a via-hole. Similarly, the upper insulating layer could be patterned requiring a via-hole to be formed only through the lower dielectric layer.

For the method described above, one possibility for patterning the pixel electrodes such that they make contact with the electrodes without shorting is to choose the lower dielectric 5 and the pixel electrode material 13 such that the lower dielectric material will repel the pixel electrode material as it is printed. The upper dielectric material 11 is chosen such that the pixel electrode material adheres well. On the area of the pixel where contact to the lower electrode is required, the upper dielectric material covers the lower dielectric material. On other areas of the pixel, the upper electrode does not overlap the lower dielectric material. This creates a channel that is repulsive to the pixel electrode material as it is being printed and can reduce the need for high print accuracy.

All of the structures described so far have been based on top gate transistors. For these structures the gate is formed on top of the source and drain. FIG. 5 shows a structure based on bottom gate transistors that has the same advantages as those described above: high pixel capacitance and high aperture ratio. In this architecture, the gate electrodes 24, pixel capacitor counter electrodes 6 and gate interconnects 22 are printed or otherwise formed on the substrate followed by a dielectric layer 5. The semiconductor layer 2, data lines 22, source 3 and drain 4 are then formed on top of the dielectric. A second insulating layer 11 is laid on top of the structure followed by a via-hole interconnection 12 and a pixel electrode 13. This architecture has an advantage over the top gate structure in that there is only a requirement to form a via-hole through one dielectric layer as opposed to two. Alternatively, the upper dielectric layer could be patterned as described in FIG. 4, eliminating the need for a via-hole forming step.

The device of the present invention may be used with voltage controlled display media such as liquid crystal or electronic paper, but also with current-driven displays, such as organic light-emitting diode displays. It may be used in both reflective and transmissive displays. The display effect and the nature of the display influence the design of the active matrix.

Preferably, all layers of the active matrix TFT array are deposited from solution, and patterned by direct printing techniques. Some of the layers such as the interconnect lines requiring a high conductivity might be deposited by vacuum deposition techniques and patterned by photolithography.

The conductivity of the gate lines and data lines has to be high for the display to fully operate. If these lines are accurately printed and/or confined by surface energy patterning they can be made from very high conductivity, low transparency materials such as colloidal metals that can be used without overly diminishing the overall transparency of the display. Alternately transparent conductors may be used if the conductivity is sufficiently high.

The conductivity of the material of any of the pixel electrodes does not have to be as high as the gate lines and data lines. In the case of transmissive displays, PEDOT, ITO or other transparent conductors may be used. For a reflective display, metals can be used for the upper, pixel electrode, providing the necessary reflectivity.

The display structure is formed on a substrate, which could be produced of glass, plastic, stainless steel or other materials. The data lines are formed from conducting material. They are preferentially formed by printing, although evaporation and photolithography may also be used. In the case where the data lines are printed they can either be printed using accurate printing alone or surface energy assisted patterning. Examples for print methods are inkjet printing, aerosol printing, offset printing, screen printing, lithography and gravure printing. The printed material could be colloidal metal or a conducting polymer such as PEDOT. Where the display effect is transmissive, very fine lines can be formed by accurate printing or other deposition methods, or, a transparent conductor may be deposited, such as PEDOT or ITO. These lines should be sufficiently conducting for display operation.

The semiconductor layer is preferentially deposited from solution although it may also be deposited by evaporation. The semiconducting material might be a small organic molecule or a conjugated polymer, or a solution-processible inorganic semiconductor, such as a dispersion of inorganic nanoparticles. Preferably, the semiconducting layer is patterned into active layer islands in order to reduce parasitic leakage currents between neighbouring pixels and devices. The semiconducting material may be deposited by inkjet printing. In addition, surface energy patterning may be used to enhance the printing resolution.

The gates and interconnects are formed from conducting material. They are preferentially formed by printing, although evaporation and the techniques of photolithography may also be used The gates and interconnects may either be printed using accurate printing alone or surface energy patterning. Examples of print methods that may be used include inkjet printing, aerosol printing, offset printing screen printing, and gravure printing. The material printed could be colloidal metal or a conducting polymer such as PEDOT. Where the display effect is transmisive very fine lines can be formed by accurate printing or other deposition methods, or, a transparent conductor such as PEDOT or ITO can be used. The lines should also be sufficiently conducting in order to minimize RC delays along the gate lines. The deposition process used should be compatible with the layers that have been previously deposited.

The pixel electrode is formed preferably by printing but may also be formed by other methods such as evaporation and photolithography. Examples of print methods that can be used include inkjet printing, aerosol printing, offset printing screen printing, and gravure printing. The material printed could be colloidal metal or a conducting polymer such as PEDOT. Where the display effect is transmissive a transparent conductor such as PEDOT can be used. The deposition process used for both layers should be compatible with previously deposited layers, the via-hole and double dielectric layer formation.

The upper, pixel electrode 13 determines the aperture ratio. Minimising the dimension d (see FIG. 3) increases the aperture ratio. This can be done through any of the patterning methods such as photolithography but is preferentially achieved by printing techniques, either by accurate printing alone or printing combined with surface energy patterning. Preferably, surface energy assisted printing is used in order to minimize the distance d, and to reduce the risk of defects and shorts between adjacent pixels. Surface energy patterning on the surface of the dielectric layer 11 can be achieved by a range of techniques including, but not limited to photolithography, microcontact printing or exposure to focussed electromagnetic radiation (WO02/095805). The surface energy pattern enables the surface regions with width d to repulse the ink of the conducting pixel electrode and allows accurate printing with minimum d.

The dielectric layers are preferentially deposited from solution although other methods such as evaporation may be used. Where deposited from solvents care should be taken that the bottom layer is insoluble in the solvent of the top dielectric layer. The upper dielectric layer may be deposited in a patterned fashion by inkjet printing, aerosol printing or other methods, so as to cover the gates and gate lines and such as to define the pixel capacitor area Where the dielectrics layer are patterned, the upper, pixel electrode can be deposited by any of the methods as described above, in direct contact with the lower pixel electrode, thus removing the need for via-hole formation as described below For a transmissive effect display, unwanted scattering of light can be avoided by either patterning the dielectric layers so as to cover a minimal area of the display and/or well matching their refractive index to those of the surrounding.

In the case of the via-hole connection configuration, the via-hole can be formed by a broad range of techniques, such as, but not limited to, laser ablation, photolithography or mechanical methods. A preferred method is the printing of solvents and subsequent filling with conductive material as described in WO01/47045. Where the via-hole is formed by the printing of solvents and it has to penetrate two dielectric layers and in some cases a semiconducting layer. For this a sequence of different solvents or a blend of two or more solvents can be used. The via-hole should be sufficiently small to fit within the pixel area without interfering with the transistor. Preferably, the via-hole should be <100 microns in diameter and most preferably <50 microns in diameter. In order to reduce any inhomogeneity of optical contrast across a pixel, the surface of the pixel electrode in the vicinity of the via-hole and above the via-hole should be smooth. Where the display medium is transmissive, the via-hole can be formed from transparent material such as PEDOT. Prefereably, the via-hole is filled with a conducting material that has a similar refractive index to that of the dielectric layer in order to reduce any light scattering. Alternatively, if the optical inhomogeneity around the via-hole is too high, the area of the via-hole can be shielded from the viewer by a black matrix. Another preferred method for the forming of via holes is laser ablation. Here, the dielectric materials are removed in a selective fashion by the rapid absorption of energy from a scanning laser beam to form via holes. The dielectric layers used can either be intrinsically absorbing or are mixed with a dye to increase the absorption at the wavelength of the laser beam. Another method incorporating laser ablation is to deposit a release layer before the dielectric layers are deposited. This release layer is highly absorbing to the wavelength of the laser beam and on absorption removes the dielectric layers deposited on top. After formation, via holes are then filled with a conducting material, preferably using a print based method such as ink jet.

The embodiment shown in FIG. 3 is a three level device architecture incorporating a double-sided capacitor and large aperture ratio. A via hole is formed between the first and third level and the third and second level to ensure electrical conduction between the levels.

The source and drain electrodes 3, 4, which consist of a conductive material such as PEDOT/PSS, may be deposited on the first metal level by a technique such as jet printing. Inkjet printed colloidal silver may be confined by surface energy patterning to form data lines 20. The semiconductor 2 which may consist of a material such as poly(dioctylfluorene-co-bithiophene) (F8T2) in a solution of xylene may be deposited by a technique such as inkjet printing into an active layer island, in order to reduce parasitic leakage currents between neighbouring pixels and devices. A continuous dielectric layer 5 may be deposited by techniques such as spin-coating to provide electrical insulation between the electrodes and connections at different levels. A suitable material for such an insulating layer may be polymethylmethacrylate (PMMA). On a third level of the device the gate electrode 24, and gate addressing lines 22 are formed by the deposition of a conductive material such as colloidal silver or PEDOT/PSS. Also on the third metal level is the pixel capacitor counter electrode 6. This is followed by a second continuous dielectric layer of polystyrene deposited in between the third and second metal layer of the device by spin-coating, blade coating or other solution processing techniques. A patterned pixel electrode forming one of the contacts to the display element 13 is formed on a separate, second metal level of the device. The pixel electrodes on metal levels 6, 13 may be formed by inkjet printed PEDOT or ITO or other transparent conductors (transmissive display) or colloidal silver (reflective display).

As previously described, the pixel capacitor is formed between the pixel capacitor counter electrode 6 which is connected to the gate addressing lines 22 and the pixel electrode 13 on the third level. According to a further above mentioned embodiment of the invention it is also possible to form an additional capacitor between the pixel capacitor counter electrode 13 on the third level, and an extension of the drain electrode 4 on the first level. The formation of this double-sided capacitor has been seen to increase the total capacitance of the pixel capacitor for a given area of the counter electrode.

In order to ensure electrical conduction between the three levels of the device, a via-hole is formed. The via-hole is formed between the pixels on each metal level of the device. A via-hole may be formed either by printing techniques or by methods of laser ablation.

Printing techniques such as, but not limited to inkjet printing may be used to produce a via-hole in the above described device. A solvent or mixture of solvents is deposited that are able to dissolve both the first and second dielectric material, but differentiates between lower pixels. In the case of the above mentioned PMMA dielectric layer, ethyl acetate may be used as a suitable solvent. The resultant via-hole may then be filled with a conductive material, forming a connection between the two pixels, such as PEDOT.

Alternatively, a technique of laser ablation may be used. The via channels may be formed either by using a rastering laser where the wavelength of the laser is absorbed by the dielectric materials or where an absorbing dye is added to the dielectric layers. After the via channels are formed, they may be filled with a conductive material using techniques such as inkjet printing. Such a system would allow successful via-hole formation by virtue of the non-solubility of the dielectric layers in the via-hole solvent.

In the alternative embodiment shown in FIG. 4 a three level device architecture incorporates polyvinylphenol (PVP) as the gate dielectric 5, followed by polystyrene for the second dielectric layer 11. Isopropanol and xylene or xexane are possible solvents for the formation of the via-holes in these layers, although as mentioned above, this embodiment can be produced without forming via-holes.

The source and drain electrodes 3, 4, which consist of a conductive material such as PEDOT/PSS, are deposited on the first metal level by a technique such as inkjet printing. Inkjet printed colloidal silver may be confined by surface energy patterning to form data lines 3. The semiconductor 2 which may consist of a material such as poly(dioctylfluorene-co-bithiophene) (F8T2) in a solution such as xylene may be deposited by a technique such as inkjet printing into an active layer island, in order to reduce parasitic leakage currents between neighbouring pixels and devices. A patterned dielectric layer 5 of polyvinylphenol (PVP) may be deposited by a technique such as inkjet printing on a surface energy pattern, as previously described or other patterning techniques in order to provide adequate isolation between the gate electrodes and the interconnects on the third level and electrodes on the first and second level. On a third level of the device the gate electrode 24 and gate addressing lines 22 are formed by the deposition of a conductive material such as colloidal silver or PEDOT/PSS. Also on the third metal level is a pixel capacitor counter electrode 6. This is followed by a second patterned dielectric layer of polyvinylalcohol (PVA) deposited in between the third and second metal layer of the device by techniques such as inkjet printing or in a continuous film by techniques such as spin coating, blade coating or spray coating, followed by patterning techniques such as laser ablation. A patterned pixel electrode forming one of the contacts to the display element 13 is formed partially on the first level and partially on the second level of the device with a metallic connection formed across a side wall of the patterned dielectric(s). The pixel electrode 13 may be formed by inkjet printed PEDOT or ITO or other transparent conductors (transmissive display) or colloidal silver (reflective display).

As previously described a double-sided capacitor has again been formed, thereby increasing the total capacitance of the pixel capacitor for a given area of the counter electrode.

There is no requirement for the formation of a via-hole interconnect to be incorporated within this device architecture.

The combination of materials and processes used to fabricate this invention are ideally tailored to the end use of the device. For a reflective display, there is no need for the active matrix backplane components to be transparent. However, for a transmissive display, one arrangement would incorporate a combination of high conductivity, highly confined opaque conducting materials with lower conductivity transparent conductors. The highly conducting, well confined materials, for example colloidal silver, which can be deposited in many ways including surface energy assisted printing or aerosol, would be used as the data lines and interconnect lines. The confined nature of these features means that the transmission of the display is not seriously affected. The transparent, lower conductivity elements, for example ITO or PEDOT, which can also be deposited using printing or other methods, are used for the pixel and storage capacitance electrodes. This combination of high conductivity and high resolution patterned layers combined with low conductivity transparent layers enables the fabrication of a print based transparent display with high aperture ratio and high pixel capacitance.

Some of the conducting electrodes of the TFT and/or the connections in the display device may be formed from inorganic conductors that may, for example, be deposited by the printing of a colloidal suspension or by electroplating onto a pre-patterned substrate. In devices where not all of the layers need to be deposited from solution, one or more of the conductive components of the device may be formed from an insoluble conductive material such as a vacuum-deposited conductor.

Any solution processible conjugated polymeric or oligomeric material that exhibits adequate field-effect mobilities exceeding $10^{-3}$ cm$^2$/Vs, preferably exceeding $10^{-2}$ cm$^2$/Vs, may be used for the formation of the semiconducting layer. Suitable materials are reviewed in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)).

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithograpbic patterning (see WO 99/10939), offset printing, flexographic printing or other graphic arts printing techniques. Ink-jet printing is considered to be particularly suitable for large area patterning with good registration, in particular for flexible plastic substrates.

Although preferably all layers and components of the device and circuit are deposited and patterned by solution processing and printing techniques, one or more components may also be deposited by vacuum deposition techniques and/or patterned by a photolithographic process.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of producing a pixellated display device including a display medium, an array of transistors, addressing lines for controlling the transistors, and an array of pixel electrodes located at least partly between the array of transistors and the display medium and via which respective portions of the display medium are controllable by the transistors, wherein each pixel electrode is controllable through a respective transistor via one of said addressing lines and also overlaps with another of said addressing lines and/or a counter electrode connected thereto for capacitive coupling therewith, wherein each transistor is a thin-film transistor including source, drain and gate electrodes, and wherein each pixel electrode is connected to one of the underlying source or drain electrodes of the respective transistor via a conductive vertical interconnect through one or more insulator layers, and wherein the method comprises defining in said one or more insulator layers holes that extend down to the underlying source or drain electrodes using a photoablative technique that discriminates between the underlying source or drain electrodes and said one or more insulator layers; and then depositing conductive material in said holes.

2. A method of producing an electronic device including a lower conductive layer deposited from solution and an upper conductive layer overlying said lower conductive layer and electrically connected thereto via a conductive interconnect through one or more insulator layers, wherein the creation of said interconnect includes: defining in said at least one insulator layer a hole that extends down to at least a portion of the lower conductive layer using a photoablative technique that discriminates between the lower conductive layer and said one or more insulator layers; and then depositing conductive material in said hole.

3. A method according to claim 2, wherein said photoablative technique includes: selectively incorporating into said one or more insulator layers a light-absorbing agent, and using light of a wavelength at which said light-absorbing agent has an absorption peak.

4. A method according to claim 2, wherein said discriminatory photoablative technique includes providing a release layer between the lower conductive layer and said one or more insulator layers, and irradiating the release layer with light of a wavelength for which it is selectively absorbing so as to cause the release layer to propel an overlying portion of said one or more insulator layers away from the substrate whilst leaving at least an underlying portion of the lower conductive layer intact.

5. A method of producing an electronic device including a lower conductive layer formed by solution-processing and an upper conductive layer overlying said lower conductive layer and electrically connected thereto via a conductive interconnect through one or more insulator layers, wherein the creation of said interconnect includes: defining in said at least one insulator layer a hole that extends down to at least a portion of the lower conductive layer using a photoablative technique that discriminates between the lower conductive layer and said one or more insulator layers; and then depositing conductive material in said hole, wherein said one or more of said one or more insulator layers comprises a mixture of an insulating material and a dye, and said photoablative technique includes: using light of a wavelength at which said dye has an absorption peak.

6. A method of producing an electronic device including a lower conductive layer formed by solution-processing and an upper conductive layer overlying said lower conductive layer and electrically connected thereto via a conductive interconnect through one or more insulator layers, wherein the creation of said interconnect includes: defining in said at least one insulator layer a hole that extends down to at least a portion of the lower conductive layer using a photoablative technique that discriminates between the lower conductive layer and said one or more insulator layers; and then depositing conductive material in said hole, wherein said discriminatory photoablative technique includes providing a release layer between the lower conductive layer and said one or more insulator layers, wherein said release layer is deposited before said one or more insulator layers are deposited, and irradiating the release layer with light of a wavelength for which it is selectively absorbing so as to cause the release layer to propel an overlying portion of said one or more insulator layers away from the substrate whilst leaving at least an underlying portion of the lower conductive layer intact.

7. A method according to claim 2, wherein the lower conductive layer is the drain or source electrode of a thin-film transistor device, and the upper conductive layer is a pixel electrode associated with said thin film transistor device.

8. A method according to claim 4, wherein the lower conductive layer is the drain or source electrode of a thin-film transistor device, and the upper conductive layer is a pixel electrode associated with said thin film transistor device.

9. A method according to claim 5, wherein the lower conductive layer is the drain or source electrode of a thin-film transistor device, and the upper conductive layer is a pixel electrode associated with said thin film transistor device.

* * * * *